(12) United States Patent
Hofmann et al.

(10) Patent No.: US 7,265,424 B2
(45) Date of Patent: Sep. 4, 2007

(54) FIN FIELD-EFFECT TRANSISTOR AND METHOD FOR PRODUCING A FIN FIELD EFFECT-TRANSISTOR

(75) Inventors: Franz Hofmann, Munich (DE); Johannes Kretz, Munich (DE); Wolfgang Roesner, Ottobrunn (DE); Thomas Schulz, Austin, TX (US)

(73) Assignee: Infineon Technologies AG (DE)

( * ) Notice: Subject to any disclaimer, the term of this patent is extended or adjusted under 35 U.S.C. 154(b) by 108 days.

(21) Appl. No.: 10/768,971

(22) Filed: Jan. 30, 2004

(65) Prior Publication Data

US 2004/0217408 A1 Nov. 4, 2004

Related U.S. Application Data

(63) Continuation of application No. PCT/DE02/02760, filed on Jul. 26, 2002.

(30) Foreign Application Priority Data

Jul. 30, 2001 (DE) ................. 101 37 217

(51) Int. Cl.
H01L 29/76 (2006.01)
(52) U.S. Cl. ............ 257/368; 257/377; 257/382; 257/471
(58) Field of Classification Search ........... 257/368, 257/377, 382, 471
See application file for complete search history.

(56) References Cited

U.S. PATENT DOCUMENTS

| | | | |
|---|---|---|---|
| 4,996,574 A | 2/1991 | Shirasaki | |
| 5,300,455 A | 4/1994 | Vuillermoz et al. | |
| 5,623,155 A | 4/1997 | Kerber et al. | |
| 5,915,183 A | 6/1999 | Gambino et al. | |
| 6,091,076 A | 7/2000 | Deleonibus | |
| 6,207,511 B1 | 3/2001 | Chapman et al. | |
| 6,252,284 B1 | 6/2001 | Muller et al. | |
| 2001/0036693 A1* | 11/2001 | Brigham et al. | ............ 438/183 |

OTHER PUBLICATIONS

Fujiwara, A. et al: "Suppression of Unintentional Formation of Parasitic SI Islands on ASI Single-Electron Transistor by the Use of Sin Masked Oxidation"; Extended Abstracts of the 1997 International Conference on Solid State Devices and Materials, Japan Society of Applied Physics. Tokyo, Japan, Sep. 1, 1997, pp. 482-483.
Ishii, T. et al: "Characterization of One-Dimensional Conduction in an Ultra-Thin Poly-Si Wire"; Extended Abstracts of the International Conference on Solid State Devices and Materials, Japan Society of Applied Physics. Tokyo, Japan, Aug. 21, 1995, pp. 201-203.
Hisamoto, Digh et al: "A Fully Depleted Lean-Channel Transistor (DELTA)—A Novel Vertical Ultrathin SOI MOSFET"; IEEE Electron Device Letters, vol. 11, No.1, Jan. 1990, pp. 36-38.
Hisamoto, Digh et al: "A Folded-Channel MOSFET for Deep-sub-tenth Micron Era"; IEDM 98, pp. 1032-1034, 1998.
Kedzierski, Jakub et al: "Complementary silicide source/drain thin-body MOSFETS for the 20nm gate length regime"; IEDM 2000, pp. 57-60.

\* cited by examiner

*Primary Examiner*—Edward Wojciechowicz
(74) *Attorney, Agent, or Firm*—Dickstein, Shapiro, LLP.

(57) ABSTRACT

A fin field effect transistor having a substrate, a fin structure above the substrate, as well as a drain region and a source region outside the fin structure above the substrate. The fin structure serves as a channel between the source region and the drain region. The source and drain regions are formed once the gate has been produced.

17 Claims, 6 Drawing Sheets

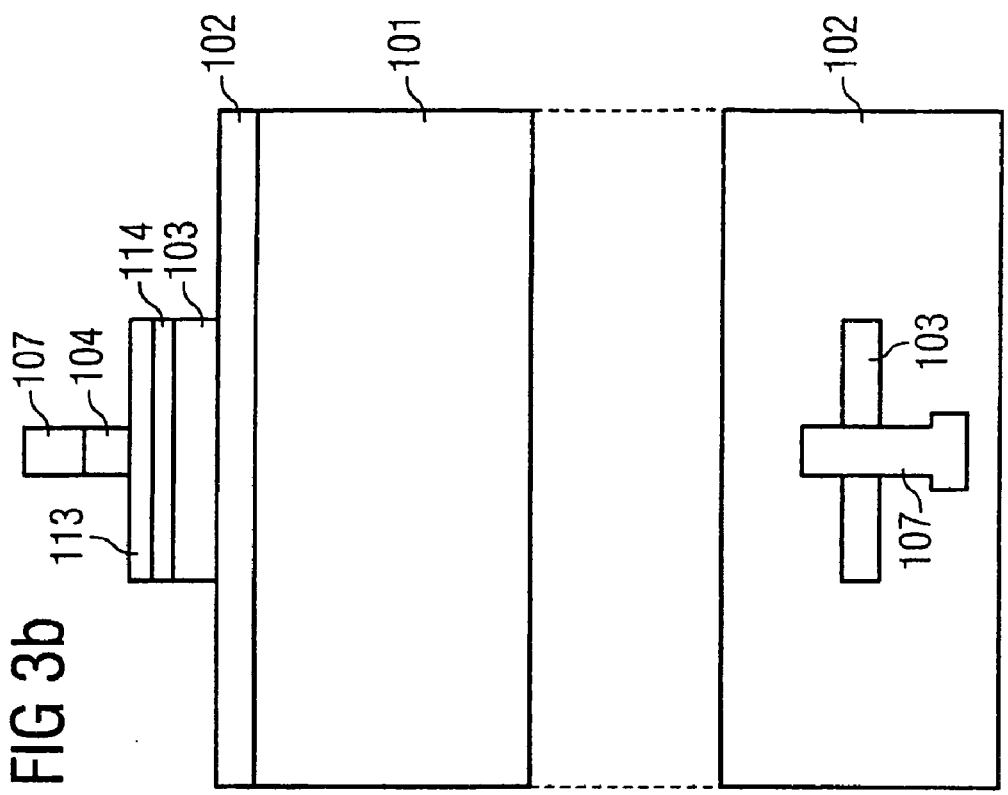
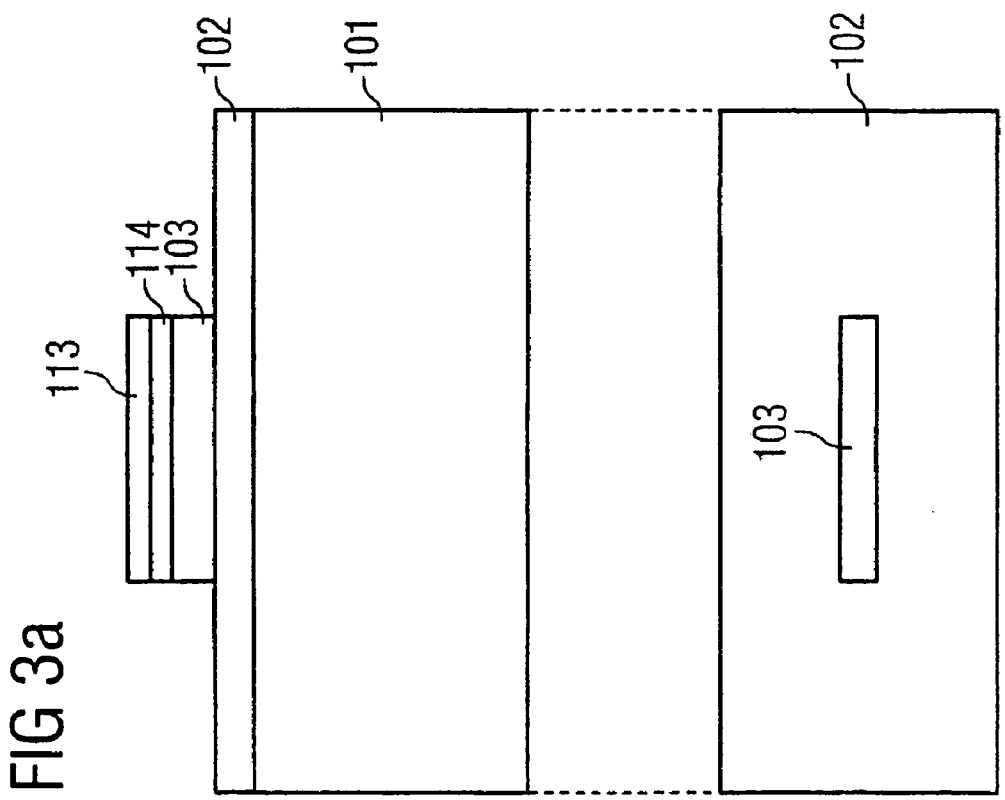

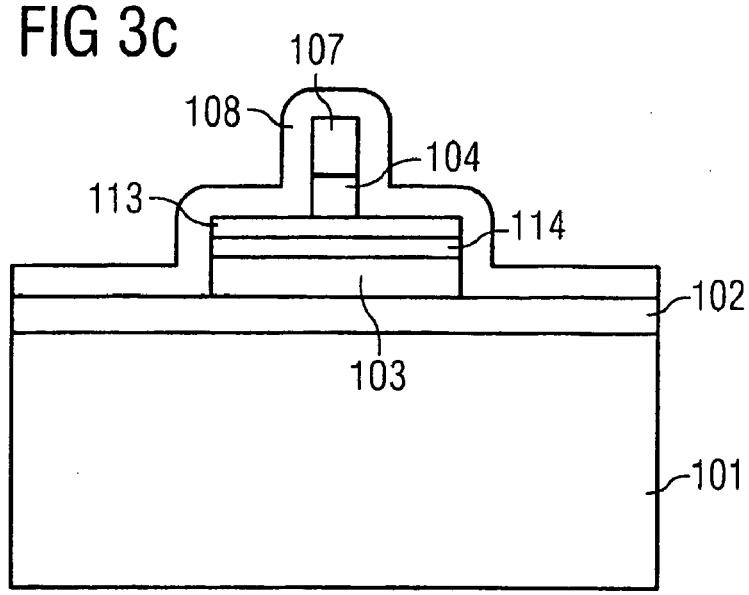
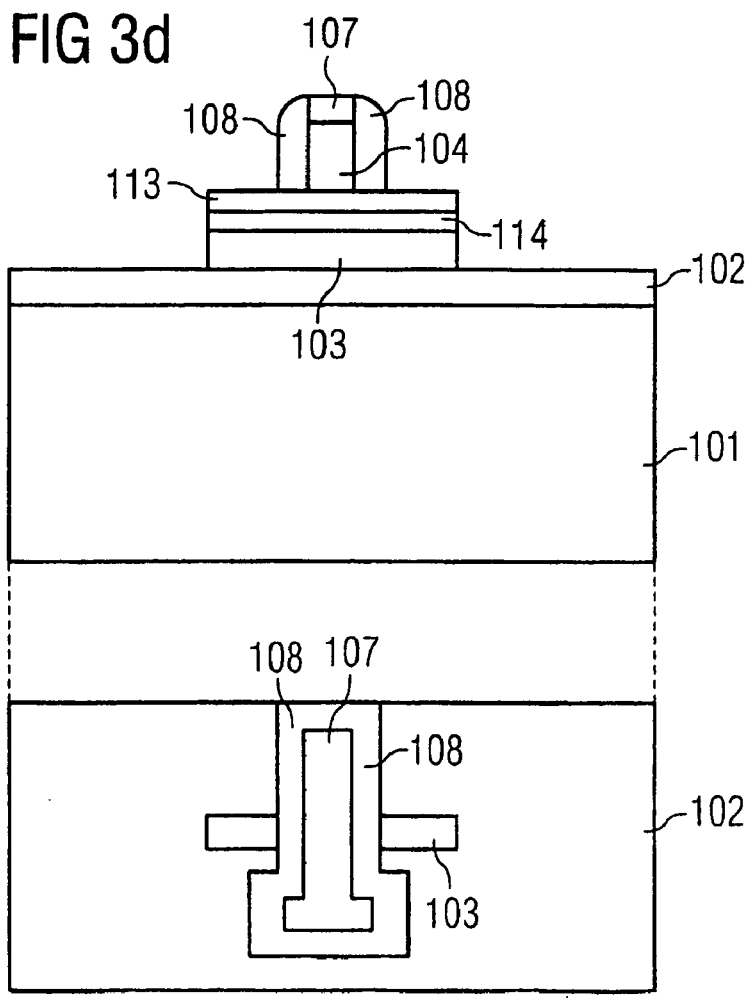

FIN FIELD-EFFECT TRANSISTOR AND METHOD FOR PRODUCING A FIN FIELD EFFECT-TRANSISTOR

CROSS-REFERENCE TO RELATED APPLICATION

This application is a continuation of International Patent Application Serial No. PCT/DE02/02760, filed Jul. 26, 2002, which published in German on Feb. 20, 2003 as WO 03/015182 A2.

FIELD OF THE INVENTION

The present invention relates to a fin field-effect transistor and a method for fabricating a fin field-effect transistor.

BACKGROUND OF THE INVENTION

A fin field-effect transistor and a method for fabricating such a fin field-effect transistor are described in D. Hisamoto et al., A Fully Depleted Lean-Channel Transistor (DELTA)—A novel vertical ultrathin SOI MOSFET, IEEE Electron Device Letters, Volume 11, No. 1, pages 36-38, 1990 (hereinafter Hisamoto 1990.) FIG. 2 shows such a fin field-effect transistor 200 having a silicon substrate 201 and an oxide layer 202 made of silicon oxide $SiO_2$ on the silicon susbtrate 201.

A fin 203 made of silicon is provided on a part of the oxide layer 202. A gate 204 of the resulting fin field-effect transistor 200 is arranged above a part of the fin 203 and along the entire height of the part of the fin.

In the case of the fin field-effect transistor 200 described in Hisamoto 1990, the channel region, not visible in the figure, of the fin 203 can be inverted by charge carriers with the aid of the gate 204 extending along the side walls 205 of the fin 203. The fin 203, which is also referred to as a Mesa, has on its end sections a source region 206 and a drain region 207.

In the case of the fin field-effect transistor 200 described in Hisamoto 1990, there is no self-aligned spacer technology for the LDD implantation or HDD implantation, in order that the fin 203 is not highly doped with doping atoms in the source region 206 and in the drain region 207 until after the application of the gate, and that an overlapping of the gate and the source or drain region, and a disadvantageous control response, associated therewith in turn, of the transistor is avoided.

In the case of the fin field-effect, transistor 200 described in Hisamoto 1990, there are firstly formed along the side walls 205 of the fin 203 oxide spacers 208 which prevent a doping of the fin 203 by implantation via the side walls 205. In the case of implantation via the free fin surfaces, however, in addition to the source region 206 and the drain region 207, the channel region that is not protected by oxide spacers is provided with doping atoms. In the case of this underdiffusion, doping atoms pass laterally into the channel region after their implantation. Particularly in the case of short channel lengths—such as occur in the case of the known fin field-effect transistor—such underdiffusion has substantial negative effects on the control response of the field-effect transistor.

Furthermore, there is described in D. Hisamoto et al., A folded-channel MOSFET for deep-sub-tenth micron era, IEDM 98, pages 1032-1034, 1998 (hereinafter Hisamoto 1998) a fin field-effect transistor in the case of which the silicon fin is fed through in the horizontal direction by the electric current to be controlled. In the fabrication method in accordance with Hisamoto 1998, the highly doped source/drain regions are already present when the gate oxide made of silicon dioxide is grown on. This leads to a substantial running of the dopant and to undesired series resistances, particularly in the case of a very short channel.

J. Kedzierski et al., Complementary silicide source/drain thin-body MOSFETs for the 20 nm gate length regime, IEDM 2000, pages 57-60, describes a MOS field-effect transistor in the case of which the drain region and the source region are formed from platinum silicide.

U.S. Pat. No. 6,252,284 B1 describes a planarized fin field-effect transistor in the case of which a spacer is arranged as electrical insulation layer between source and gate and between drain and gate, respectively, in each case between source and gate and between drain and gate.

Furthermore, U.S. Pat. No. 5,300,455 A describes a method for fabricating an electrically conductive diffusion barrier at the metal/silicon interface of an MOS field-effect transistor.

U.S. Pat. No. 6,207,511 B1 describes a transistor having one or more strip channels and in the case of which the current flow takes place in the lateral direction between source and drain. The gate is located at the side walls and, if required, on the strip channel or channels.

U.S. Pat. No. 5,623,155 A describes an SOI-MOS field-effect transistor.

U.S. Pat. No. 4,996,574 A describes an MIS transistor structure for increasing the conductivity between source and drain.

SUMMARY OF THE INVENTION

The present invention is based on the problem of specifying a fin field-effect transistor in which underdiffusion in the channel region below the gate in the context of implantation with doping atoms is avoided, and in which running of doping atoms is avoided and series resistances caused thereby are prevented.

Furthermore, the present invention is based on the problem of specifying a method for fabricating such a fin field effect transistor.

The problems are solved by the fin field-effect transistor and by the method for fabricating the fin field-effect transistor having the features in accordance with the claims of the present application.

In the context of the present invention, a fin field-effect transistor should generally be understood to mean a field effect transistor whose channel region is of fin-shaped construction and constructed in a vertically projecting fashion—also in an uncovered manner, or above an insulator layer, for example an oxide layer. The fin field-effect transistor has a gate which extends partly above a vertically projecting structure and along its side walls.

A fin field-effect transistor according to the present invention has a substrate, a fin above the substrate, and also a drain region and a source region outside the fin above the substrate. In this case, the fin does not contain the source region and the drain region, as it does in known fin field-effect transistor arrangements. The fin serves only as a channel between source region and drain region. A diffusion barrier is arranged in each case between the drain region and the fin and between the source region and the fin.

A further fin field-effect transistor according to the present invention, which optionally has a diffusion barrier in the same way as the previously described fin field effect transistor, has a substrate, a fin above the substrate, and a drain region and a source region outside the fin above the substrate with the fin serving as a channel between source region and drain region.

The drain region and the source region are formed from a material with metallic conductivity in electrical terms, a Schottky barrier being formed between the drain region and the fin and between the source region and the fin.

The material with metallic conductivity can be platinum silicide, platinum germanium silicide or erbium silicide. It is preferred to use platinum silicide or platinum germanium silicide as material with metallic conductivity in a p-channel MOS fin field-effect transistor, and erbium silicide as material with metallic conductivity in an n-channel MOS fin field-effect transistor.

In an exemplary method according to the present invention for fabricating a fin field-effect transistor, a fin is formed above a substrate. A gate layer is formed at least above a part of the fin. The arrangement thereby formed, if appropriate extended by gate protective layer and gate spacer according to one of the following advantageous developments of the present invention, is coated with an insulation layer. Subsequently, the insulation layer is removed in the region of the ends of the fin in such a way that at least a part of the two ends of the fin is uncovered. The regions uncovered from the insulation layer are filled at least partly with material for forming a source region and a drain region.

The present invention specifies for the first time a fin field-effect transistor in the case of which the fabrication of the channel region and the fabrication of the source and drain regions are performed in a fashion uncoupled from one another. The associated fabrication methods can also be optimized separately from one another.

In this case, the gate is fabricated above the channel before source and drain regions are fabricated. This creates a self-aligned arrangement in the case of which the gate region cannot overlap with the source region or the drain region and thus bring about undesired coupling capacitances.

Moreover, the running of doping atoms owing to the production, occurring after the fabrication of the gate, of the highly doped source and drain regions is avoided in the case of the present invention, as a result of which no undesired series resistances are formed.

Moreover, in the case of a fin field-effect transistor according to the present invention, the source region and the drain region of the fin remain freely accessible, thereby enabling exact and simple doping of the source region and of the drain region of the fin.

Preferred developments of the invention emerge from the dependent claims.

The refinements described below refer both to the fin field-effect transistor and to methods for fabricating the fin field-effect transistor.

The substrate may have silicon, and, as an alternative, it is also possible to provide on the substrate a further layer, for example made of silicon oxide, generally made of an oxide on which the fin and also the gate are arranged.

In accordance with a refinement of the present invention, the gate has polysilicon. Furthermore, the gate may also be formed by a stack of polysilicon and tungsten silicide.

The spacer may have silicon oxide and/or silicon nitride.

The drain region and/or the source region may have polysilicon.

The source region may be arranged at one end of the fin, and the drain region may be arranged at the other end of the fin.

In a further advantageous development of the present invention, the source region on one end face of the fin cooperates with the fin, and the drain region on the other end face of the fin cooperates with the fin, the end faces terminating the fin in its longitudinal extent.

The source region can, however, also additionally cooperate with the fin with a part, not covered by a gate, of a broad side of the fin, and the drain region can cooperate with the fin with a further part, not covered by the gate, of a broad side of the fin, the broad sides connecting the end faces of the fin to one another. The area of the active connection of source and drain to the channel is thereby increased. In this case source and drain regions can directly adjoin the fin.

In a further advantageous development of the present invention, the source region cooperates with the fin exclusively at one end face of the fin, and the drain region cooperates with the fin exclusively at the other end face of the fin. This refinement is particularly advantageous whenever the aim is to arrange one diffusion barrier each between drain region and fin, and between source region and fin, which diffusion barrier is intended to prevent indiffusion of the dopant for source and drain.

A gate and a spacer can be arranged at least above a part of the fin and in this case extend essentially along the entire height of the part of the fin. The gate layer can be arranged between spacers in this case. The gate layer can also be covered by a protective layer. If, moreover, an oxide layer and/or a nitride layer are/is provided between fin and gate layer relative to the underside of the gate layer, the gate is encapsulated. The encapsulation components preferably have silicon oxide or silicon nitride. In this case, it is also possible to use both materials in layers so that one material can be etched selectively relative to the other, simplified fabrication methods thereby being possible. It is to be noted in this context that this described encapsulation can also advantageously be provided in the case of a fin field effect transistor in which the diffusion barriers are not provided.

The gate and/or the spacers may extend essentially along the entire height of the part of the fin. Furthermore, the height of the spacer with respect to the substrate may be essentially equal to the height of the gate.

Underdiffusion during implantation of the source region and drain region of the fin field-effect transistor is practically completely avoided by virtue of this refinement.

The gate including the edge-side spacers can extend along the entire length of the fin, the spacers terminating flush with the end faces of the fin, that is to say the outer sides of these edge-side spacers lie in one plane with the end faces of the fin. In the case of this advantageous development, it is then only the end faces of the fin that are freely accessible to coupling with the subsequently inserted source and drain regions, it being possible here to provide the dielectric barriers, with their previously described advantages, in a particularly simple way.

The subsequently deposited drain and source regions can have a smaller height above the substrate surface than the insulating region. As a result, there is no need for the uncovered regions in the insulation layer to be filled up completely, and so the design height of the overall arrangement can be kept small.

In order to form the fin of the fin field-effect transistor, it is possible to apply a mask marking a fin on one silicon layer of a substrate of two silicon layers enclosing a basic oxide layer. The silicon material of this layer is removed in such a way that a silicon body in the form of the fin is formed on the insulation layer. The hard-surface mask may in this case contain silicon oxide and/or silicon nitride.

The gate can be formed by the temporarily sequential application of a gate layer, the application of a protective layer to the gate layer, the application of a mask for the further structuring of the gate, and the removal of excess material of the gate and protective layers, in such a way that a strip-shaped stack, laid over the fin, made from gate layer and protective layer is formed.

Spacers may be formed in the following steps: coating the arrangement with a spacer layer, and removing the spacer layer in such a way that the further spacer layer forms spacers at least on the sides of the gate that are still uncovered before the coating with the spacer layer. The spacer layer and/or the protective layer may contain silicon nitride.

If a diffusion barrier is provided, this is performed—preferably at each uncovered end face of the fin—after the application of the insulation layer and of the at least partial uncovering of the ends of the fin.

Source and drain regions are produced by virtue of the fact that the previous arrangement of fin, gate and, if appropriate, spacers and protective layer is coated with an insulation layer, which is then removed again in the region of the ends of the fin after a masking operation marking the regions to be uncovered. These uncovered regions are then filled with a material which is already doped, or is doped after the deposition.

At least some of the elements of the fin field-effect transistor may be formed by means of deposition. Thus, in accordance with this development, it is possible to use a conventional semiconductor processing technique, thus enabling the fabrication method to be implemented in a simple and cost-effective way.

However, in addition to CVD methods it is also possible to use sputtering or vapour deposition methods to arrange layers or materials in the proposed application process.

Exemplary embodiments of the present invention are illustrated in the figures and are explained in more detail below.

BRIEF DESCRIPTION OF THE DRAWINGS

FIGS. 3a to 3f show sectional views of a fin field effect transistor illustrating the individual method steps of a method for fabricating the fin field-effect transistor of FIG. 1; FIGS. 3a, 3b, 3d and 3f show, however, the top view, belonging to the cross section, of the fin field-effect transistor in the respective method step.

DETAILED DESCRIPTION

Figure 1:
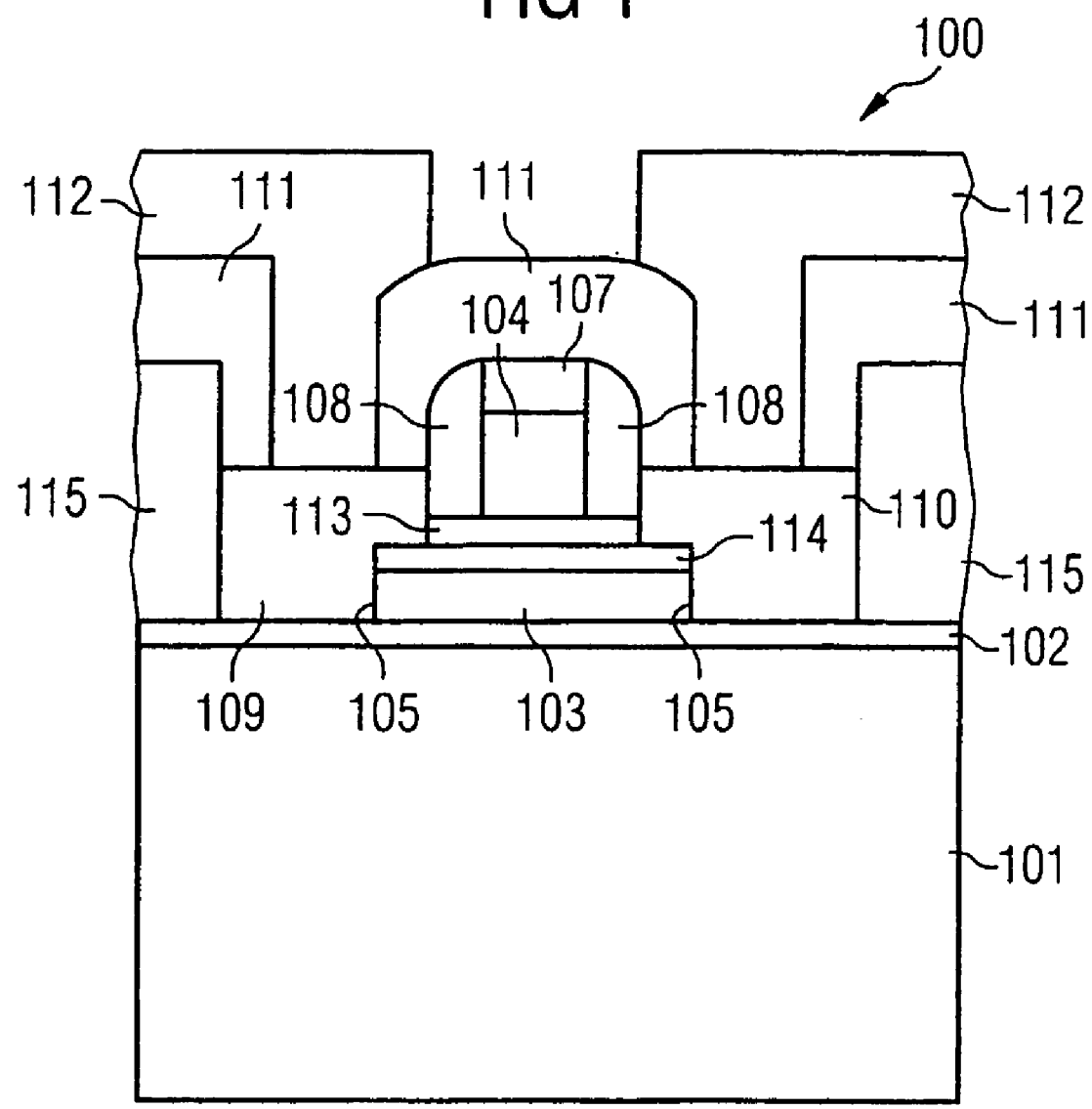
FIG. 1 shows a longitudinal section of an exemplary embodiment of a fin field-effect transistor in accordance with the present invention.
Figure 2:
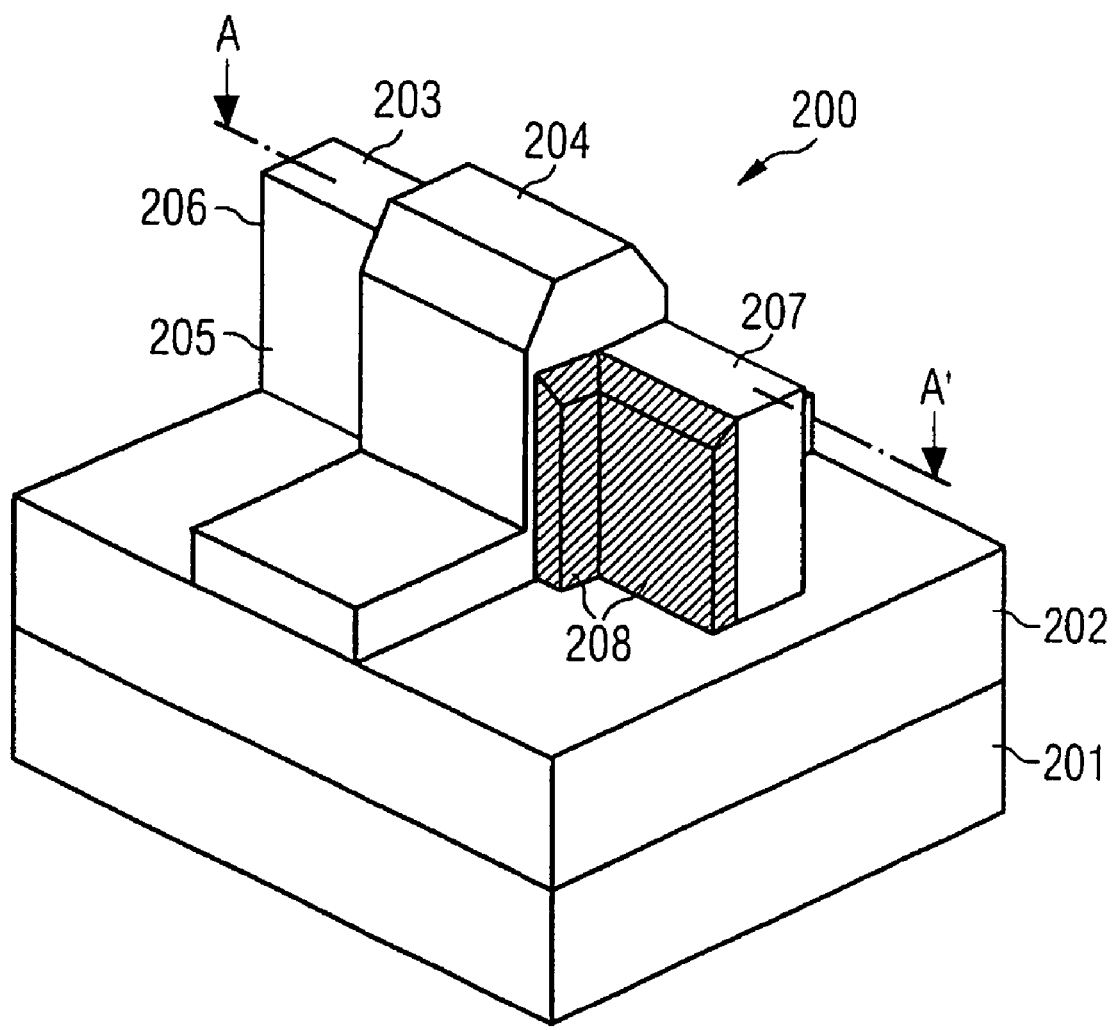
FIG. 2 shows an oblique view of a fin field-effect transistor in accordance with the prior art.

FIG. 1 shows a fin field-effect transistor 100 in accordance with an exemplary embodiment of the present invention, in longitudinal section. The section is carried out in this case longitudinally through the fin of the fin field-effect transistor, approximately along the section line A-A', to be seen in FIG. 2, in the middle of the fin, FIG. 2 being used in this context merely to explain the position of the section line with reference to the fin. Otherwise, however, the longitudinal section according to FIG. 1 is a longitudinal section through a fin field effect transistor according to the present invention, but the fin field-effect transistor according to FIG. 2 is a known fin field-effect transistor whose longitudinal section differs substantially from the longitudinal section according to FIG. 1.

The fin field effect transistor 100 has a substrate 101, on which an oxide layer 102 made of silicon oxide $SiO_2$ having a layer thickness of approximately 200 nm is arranged (compare FIG. 1).

A fin 103 made of silicon is formed on the oxide layer 102. Spacers 108—preferably made of silicon nitride $Si_3N_4$—and a gate 104 made of polysilicon are arranged between the spacers 108 above a subregion of the fin 103. The gate layer may also have p+-doped SiGe.

A nitride layer 114—preferably made of silicon nitride $Si_3N_4$—and an oxide layer 113—preferably made of silicon oxide $SiO_2$—lie arranged one above another between the gate 104 and the spacers 108, on the one hand, and the fin 103, on the other hand. The nitride layer 114 is used in order to ensure that the gate oxidization is performed only on the side walls of the gate. The oxide layer 113 serves as hard-surface mask.

A protective layer 107 made of silicon nitride $Si_3N_4$ for protecting the gate 104 is applied above the gate 104. In addition—which cannot be seen in the longitudinal section in accordance with FIG. 1—the gate arrangement 104, 107, 108 also extends, along its width at the fin 103, in the vertical direction along the broad sides of the fin 103 and in the corresponding, linearly continued region on the oxide layer 102 above the substrate 101 into the plane of the drawing and out of the plane of the drawing.

A source region 109 and a drain region 110 of the fin field-effect transistor 100 are arranged adjacent to the ends of the fin 103 and in this case on the end faces 105 of the fin 103.

Source region 109, drain region 110, fin 103 and gate arrangement 104, 107, 108 are arranged in this case in a cut-out of an insulation layer 115.

Insulation layer 115, gate arrangement 104, 107, 108 and partially also source region 109 and drain region 110 are coated by a further protective layer 111.

Contacts 112 made of metal, preferably aluminium, serve to make electric contact with source region 109 and drain region 110.

Source region 109 and drain region 110 are therefore coupled to one another in a conducting fashion as channel region via the fin 103 as a function of the control by means of the gate 104.

Hereinafter, the same reference symbols are used for identical elements in different drawings.

The individual method steps for fabricating the fin field-effect transistor 100 in accordance with the first exemplary embodiment in longitudinal section are explained below with reference to FIG. 3a to FIG. 3f. To improve the illustration, the associated top view of the fin field-effect transistor undergoing fabrication is also specified in this case in some sectional views characterizing method steps.

The fin field effect transistor 100 is designed as an SOI structure (SOI: Silicon on Isolator). In this case, the structure is constructed on the insulation layer of a wafer.

The starting point is an SOI wafer, that is to say clearly a silicon substrate 101 in which a basic oxide layer 102 made of silicon oxide $SiO_2$—also termed buried oxide—is situated interposed in the manner of a sandwich (compare FIG. 3a).

In FIG. 3a, there is already remaining on the basic oxide layer 102 only a fin 103 which has been structured from the originally present silicon layer.

In order to fabricate the fin 103, a hard-surface mask made of a nitride layer made of silicon nitride $Si_3N_4$ and of an oxide layer, lying there above, made of silicon oxide $SiO_2$ is applied to the silicon layer. This mask serves for fabricating the fin 103.

Figure 3E:
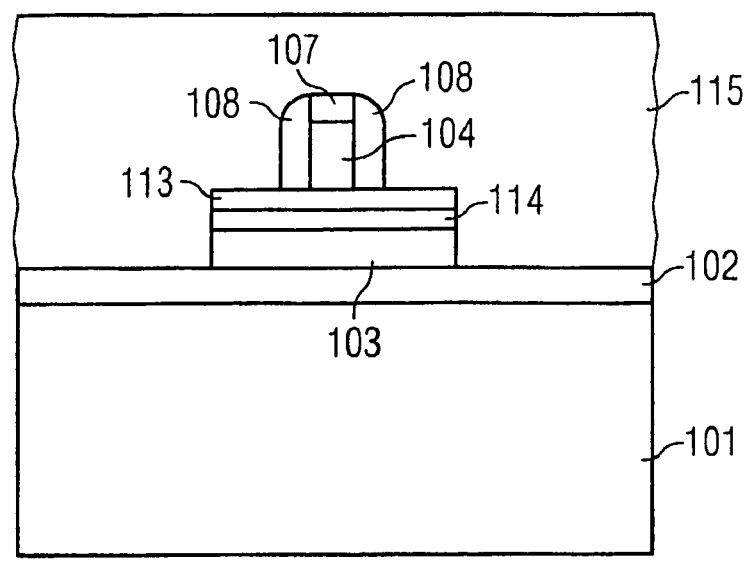
Figure 4:
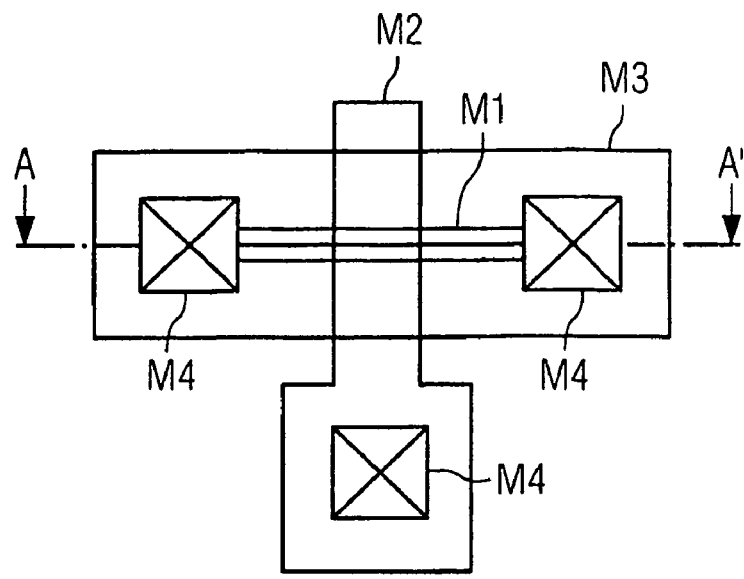
FIG. 4 shows a top view of the geometry of masks used in fabricating the fin field-effect transistor according to FIGS. 1 and 3.

The geometrical design of this mask M1 is to be seen in top view from FIG. 4. The excess material is subsequently removed from around the hard-surface mask, preferably by means of reactive ion etching after electron beam lithography has been performed, such that the structure of the fin 103 on the basic oxide layer is maintained (see FIG. 3a).

It is thereby possible subsequently to apply photoresist to the silicon layer formed, and the silicon which is not covered with photoresist can be etched by means of a dry etching method. The etching method is stopped as soon as the surface of the basic oxide layer 102 is reached.

The top view in FIG. 3a shows the fin 103 on the basic oxide layer 102, to which the shape of the mask M1 from FIG. 4 corresponds in top view.

It is subsequently possible as an option to set the threshold voltage of the fin field-effect transistor 100 by implanting doping atoms, for example boron atoms, into the fin 103. In the case of a completely depleted transistor, this channeled implantation can also be omitted in the course of the method.

In further steps, the gate is formed by gate oxidation and a protective layer is formed. For this purpose, a gate layer made of polysilicon and a protective layer made of silicon nitride $Si_3N_4$ are deposited onto the arrangement according to FIG. 3a by means of a CVD method. During the deposition of the polysilicon, the resulting polysilicon layer is doped with phosphor atoms or boron atoms (in situ doped deposition).

Subsequently, a mask is applied to the protective layer in order to form a strip-shaped stack structure of gate and protective layer. The geometrical shape of a mask in top view is shown by the mask M2 from FIG. 4. Excess material is removed after the application of the mask M2 with the aid of a suitable structuring method. For example, photoresist is applied to the silicon nitride protective layer 107 in such a way that the region which is intended to be used later as gate 104 is not etched through the photoresist in further etching steps. In a subsequent step, the silicon nitride protective layer 107 is then etched by means of a dry etching method, as also is the polysilicon layer 106, forming the gate, which is not covered with photoresist.

The etching method is terminated above the fin 103 on the oxide layer 113 and above the substrate 101 on the surface of the basic oxide layer 102, such that oxide is not etched.

The photoresist is subsequently removed from the silicon nitride layer 107.

After these method steps, a strip-shaped stack of gate 104 and protective layer 107 is arranged above the fin 103 and a part of the substrate 101 according to FIG. 3b.

Illustrated in the top view according to FIG. 3b is the protective layer strip 107 below which the gate strip 104 is situated. The strip arrangement is partially guided over the fin 103.

At one end of the strip, the latter is of widened design in order to create a suitable surface for later applying a gate contact via. The strip shaped stack corresponds in top view in this case once again approximately to the geometrical shape of the mask M2 from FIG. 4.

Spacers are formed on both sides of the uncovered edges of the gate in a further step. For this purpose, the arrangement according to FIG. 3b is coated with a spacer layer 108 (see FIG. 3c). The coating is performed by means of a conformal CVD deposition. In this case, the spacer layer 108 contains silicon nitride $Si_3N_4$.

The spacers 108 lying on the edge sides of the gate 104 are produced by anisotropic back etching of the silicon nitride spacer layer 108 with strong overetching. Spacers on the channel fin 103 are removed by the overetching. It is possible to determine, by varying the width of the spacers 108, to what extent the source and drain regions 109, 110 later produced cooperate with the channel.

FIG. 3d shows the arrangement after these fabrication steps. The gate 104 is encapsulated in this case in a structure of spacers 108 and the protective layer 107. Moreover, FIG. 3d shows once again the top view of the arrangement after the abovementioned fabrication steps. The term "encapsulated" is to be understood in this context in such a way that the gate 104 is fully covered by the spacers 108 on its side faces, and on the upper surface of the gate 104 by the protective layer 107, such that no surface areas of the gate 104 are uncovered any more.

Subsequently, an insulation layer 115 made of silicon oxide $SiO_2$ is deposited onto the arrangement according to FIG. 3d by means of a CVD method.

Subsequently, a part of the silicon oxide insulation layer 115 is removed again by means of a chemical mechanical polishing method until the silicon nitride protective layer 107 is reached. The CMP method is stopped once the silicon nitride protective layer 107 is reached.

The arrangement according to this fabrication step is shown in longitudinal section in FIG. 3e.

Subsequently, a mask is arranged on the insulation layer 115, for example in the form of photoresist. The geometrical shape of this mask is reproduced in top view by the mask M3 from FIG. 4.

Subsequently, a dry etching method is used to etch silicon oxide from the insulation layer 115 down to the surface of the basic oxide layer 102. The dry etching is selective with respect to silicon nitride, such that the etching process is stopped at the nitride layer 114 in the region of the fin 103, and the nitride-containing spacers 108 and protective layer 107 are not etched away in the region of the gate arrangement.

Figure 3F:
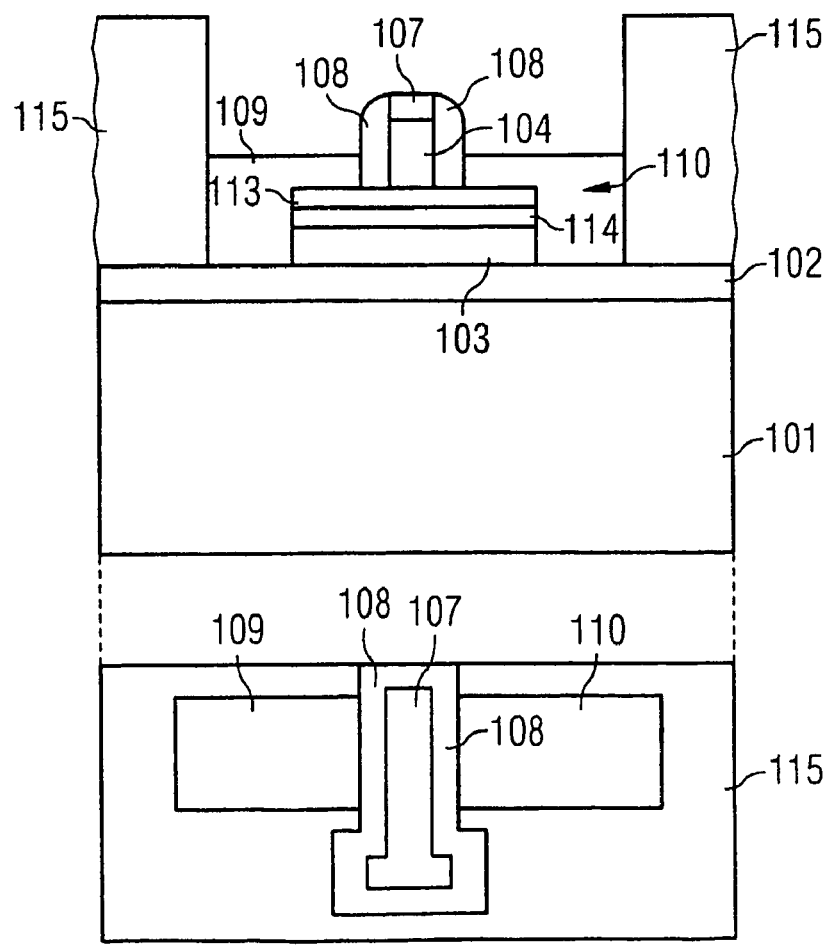

In accordance with FIG. 3f, the ends of the fin 103 are freely accessible after this fabrication step. This is necessary in order to connect the fin 103 serving as channel to a source region and a drain region.

The accesses/holes, uncovered by the preceding etching operation, to the fin ends are filled at least partially with suitable material, preferably polysilicon, in order to form a source region and a drain region, a thin dielectric layer, forming a diffusion barrier, previously being applied to the uncovered accesses/holes to the fin ends, which are intended to prevent diffusion of doping atoms from source and drain into the channel region. The polysilicon is applied to the diffusion barrier layer.

During the filling of the accesses with polysilicon, the resulting polysilicon layer is doped with suitable doping atoms (in-situ-doped filling). However, the polysilicon can also be applied by selective epitaxy or by CVD deposition with a subsequent CMP method and/or suitable back etching.

As an alternative to the in-situ doping, the doping of the source region and the drain region can also be performed by subsequent n+-implantation.

In any case, the production of the source and drain regions 109, 110 is performed after the construction of the gate 104 above the fin 103, and so a field-effect transistor of self-adjusted design is created in the case of which gate region and source or drain regions do not overlap and influence one another disadvantageously.

An undesired implantation of atoms into the channel region is also avoided with this fabrication method.

FIG. 3f shows an arrangement after carrying out these fabrication steps in longitudinal section and in top view.

In final standard semiconductor process steps, siliciding takes place and produces a silicide layer on the source and drain regions 109, 110 for the purpose of reducing the contact resistance to contacts, still to be fitted, for source, gate and drain. Tungsten serves as actual contact material. Serving in this case as an adhesion layer and a diffusion barrier therefor is a double layer made of titanium and titanium nitride which is sputtered onto the source region 109 and the drain region 110. Only then is contact made with the gate, source and drain.

The contact vias are once again obtained with the aid of etching processes. Firstly, a further protective layer 110 is deposited using the CVD method onto the existing arrangement for this purpose. Subsequently, a mask is applied, for example in the form of photoresist, to the further protective layer 111. The geometrical shape of this mask is shown by the mask M4 in FIG. 4, in top view. The mask M4 in this case marks the regions provided for making contact with the gate, source and drain.

Subsequently, regions are etched from the further protective layer 111 by means of a dry etching method so as to create access to the source, drain and gate regions which is free and direct or indirect via the silicide layer. These accesses are then filled with metal-containing material in order to form contacts 111, 112.

A fin field-effect transistor according to the present invention is shown in FIG. 1 after these fabrication steps have been carried out.

Figure 5:
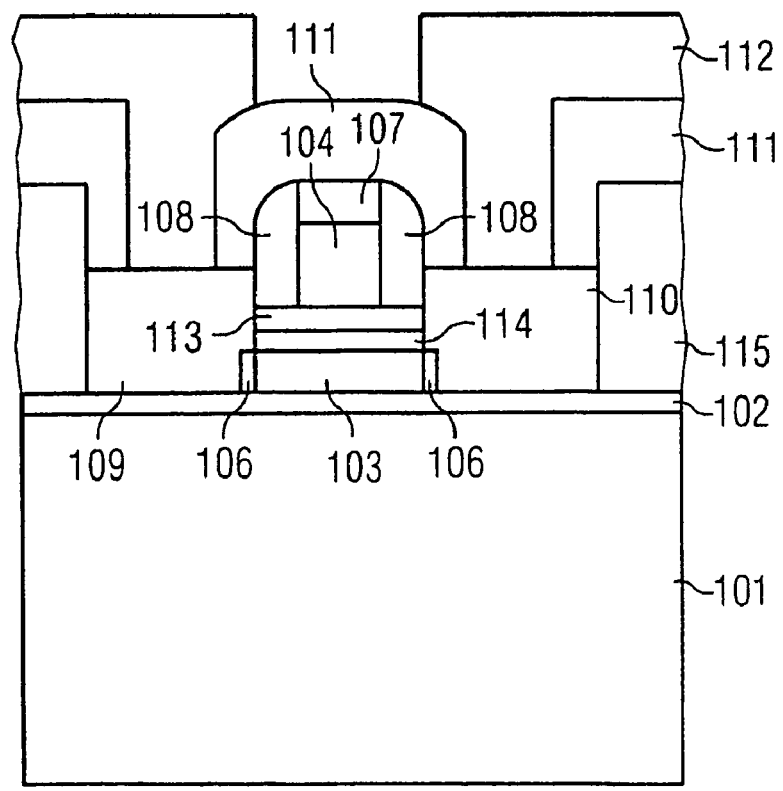
FIG. 5 shows a longitudinal section of a further exemplary embodiment of a fin field-effect transistor according to the present invention.

FIG. 5 shows a second exemplary embodiment of a fin field-effect transistor according to the present invention, in longitudinal section.

This fin field-effect transistor differs from the fin field-effect transistor in accordance with FIG. 1 and FIG. 3 in that the width of the gate 104 including the spacers 108 corresponds to the length of the fin 103.

The result of this, firstly, is that the source region 109 and the drain region 110 can cooperate with the fin 103 only on the end faces 105 thereof. The outer sides of the spacers 108 lie in a plane with the end faces 105 of the fin 103. By contrast, in the case of the exemplary embodiment according to FIG. 1 and FIG. 3 the source region 109 and the drain region 110 can also cooperate with end regions of broad sides of the fin 103, the broad sides of the fin 103 projecting from the basic oxide 102 and connecting the end faces 105 of the fin 103 to one another.

In the exemplary embodiments shown, the cooperation of source and drain regions 109, 110 with the fin 103 serving as channel can be ensured by virtue of the fact that source and drain regions 109, 110 bear against the sides provided for the purpose on the fin 103.

In the exemplary embodiment according to FIG. 5, however, there are set up according to the present invention between the end faces 105 of the fin 103 and the source region 109 and the drain region 110 diffusion barriers 106 which are intended to prevent diffusion of doping atoms from source and drain into the channel region.

In an advantageous way, these diffusion barriers are produced after the gate arrangement 104, 107, 108 has been produced, and the ends of the fin 103 have been uncovered again after the deposition of the protective layer 115, and before these uncovered regions are once again filled with material in order to form source and drain. The diffusion barriers are produced in this case by thermal oxidation.

What is claimed is:

1. A fin field-effect transistor comprising:
    an insulator layer arranged on a substrate;
    a fin arranged above the insulator layer;
    a drain region and a source region arranged outside the fin above the insulator layer and formed from a material with metallic conductivity;
    a Schottky barrier arranged between the drain region and the fin and between the source region and the fin;
    a gate which extends essentially along the entire height of at least a part of the fin; and
    a diffusion barrier arranged between each of the drain region and the fin and the source region and the fin,
    wherein the fin acts as a channel between the source region and the drain region.

2. The fin field-effect transistor according to claim 1, in which at least one of the drain region and the source region include a polysilicon.

3. The fin field-effect transistor according to claim 1, wherein the material with metallic conductivity comprises at least one a platinum silicide, a platinum germanium silicide, and an erbium silicide.

4. The fin field-effect transistor according to claim 1, wherein the substrate includes silicon oxide.

5. The fin field-effect transistor according to claim 1, wherein the fin includes silicon.

6. The fin field-effect transistor according to claim 1, wherein the source region is arranged at one end of the fin and the drain region is arranged at another end of the fin.

7. The fin field-effect transistor according to claim 6, wherein:
    two end faces terminate the fin in its longitudinal extent,
    the source region at one end face of the fin cooperates with the fin, and
    the drain region at the other end face of the fin cooperates with the fin.

8. The fin field effect transistor according to claim 7, wherein:
    two broad sides connect the end faces of the fin,
    the source region cooperates with the fin with a part, not covered by a gate, of the broad sides of the fin, and
    the drain region cooperates with the fin with a further part, not covered by the gate, of the broad sides of the fin.

9. The fin field-effect transistor according to claim 7, wherein:
    the source region cooperates with the fin exclusively at one end face of the fin, and
    the drain region cooperates with the fin exclusively at the other end face of the fin.

10. The fin field-effect transistor according to claim 1, comprising a spacer at least above a part of the fin.

11. The fin field-effect transistor according to claim 10, wherein the spacer extends essentially along the entire height of the part of the fin.

12. The fin field-effect transistor according to claim 10, wherein:
    the gate is arranged between two spacers, and
    a protective layer is arranged above the gate.

13. The fin field-effect transistor according to claim 10, wherein the spacer and the protective layer include at least one of a silicon oxide and a silicon nitride.

14. The fin field-effect transistor according to claim 10, wherein the gate extends along the entire length of the fin, and the outer sides of the spacers lie in one plane with the end faces of the fin.

15. The fin field-effect transistor according to claim 1, comprising an insulation layer at least partially bounding the source region and the drain region is provided, wherein the drain and source regions have a smaller height above the substrate surface than the insulating region.

16. A fin field-effect transistor comprising:
- a substrate;
- a fin above the substrate;
- a drain region and a source region outside the fin above the substrate, wherein the drain region and the source region are formed from a material having metallic conductivity, and a Schottky barrier is formed between the drain region and the fin and between the source region and the fin;
- a gate which extends essentially along the entire height of at least a part of the fin; and
- a diffusion barrier arranged between each of the drain region and the fin and the source region and the fin, wherein the fin acts as a channel between the source region and the drain region.

17. The fin field-effect transistor according to claim 16, wherein the material with metallic conductivity comprises at least one of a platinum silicide, a platinum germanium silicide, and an erbium silicide.

* * * * *